(12) United States Patent
Abdesselam

(10) Patent No.: US 12,278,621 B2
(45) Date of Patent: Apr. 15, 2025

(54) SHORT CIRCUIT DETECTION AND PROTECTION FOR AN INSULATED GATE COMPONENT BY MONITORING AND CHECKING THE GATE VOLTAGE

(71) Applicant: THALES, Courbevoie (FR)

(72) Inventor: Francis Abdesselam, Chatou (FR)

(73) Assignee: THALES, Courbevoie (FR)

( * ) Notice: Subject to any disclaimer, the term of this patent is extended or adjusted under 35 U.S.C. 154(b) by 180 days.

(21) Appl. No.: 17/982,436

(22) Filed: Nov. 7, 2022

(65) Prior Publication Data
US 2023/0146986 A1 May 11, 2023

(30) Foreign Application Priority Data
Nov. 8, 2021 (FR) ........................ 2111832

(51) Int. Cl.
H03K 17/081 (2006.01)
G01R 15/16 (2006.01)

(52) U.S. Cl.
CPC ....... H03K 17/08104 (2013.01); G01R 15/16 (2013.01)

(58) Field of Classification Search
CPC ................ H03K 17/08104; G01R 15/16
See application file for complete search history.

(56) References Cited

U.S. PATENT DOCUMENTS

| 5,828,539 | A | * | 10/1998 | Bijlenga | H03K 17/168 361/100 |
| 10,141,923 | B2 | | 11/2018 | Shin | |
| 2012/0248864 | A1 | | 10/2012 | Ioannidis et al. | |
| 2016/0079401 | A1 | * | 3/2016 | Zhang | H02H 3/08 361/57 |
| 2018/0062634 | A1 | * | 3/2018 | Shin | H03K 17/90 |
| 2018/0115310 | A1 | * | 4/2018 | Horiguchi | H03K 17/168 |
| 2020/0212906 | A1 | | 7/2020 | Mukunoki et al. | |
| 2021/0293874 | A1 | | 9/2021 | Kwon | |

FOREIGN PATENT DOCUMENTS

CN 108 508 342 A 9/2018

* cited by examiner

Primary Examiner — Scott Bauer
(74) Attorney, Agent, or Firm — BakerHostetler

(57) ABSTRACT

A power stage includes a power transistor controlled via a driver, the power transistor comprising three terminals, including a collector c, an emitter e and a gate g linked to the driver, the power stage comprising a detection device for detecting a short-circuit current cc between the collector c and the emitter e, the detection device comprising a voltage sensor capable of detecting a voltage Vge at the gate g of the power transistor outside of a predefined voltage range.

5 Claims, 2 Drawing Sheets

SHORT CIRCUIT DETECTION AND PROTECTION FOR AN INSULATED GATE COMPONENT BY MONITORING AND CHECKING THE GATE VOLTAGE

CROSS-REFERENCE TO RELATED APPLICATION

This application claims priority to foreign French patent application No. FR 2111832, filed on Nov. 8, 2021, the disclosure of which is incorporated by reference in its entirety.

FIELD OF THE INVENTION

The field of the invention is that of the power electronic module controls used to drive the operation of power electronic components. As is known, the power modules represent electronic components handling high powers and, thereby, demanding particular attention in their design and their tracking throughout their life and use.

BACKGROUND

More specifically, the invention deals with the protection of the insulated gate power components such as insulated gate power transistors IGBT (Insulated Gate Bipolar Transistor) or even insulated gate field effect transistors MOSFET (Metal Oxide Semiconductor Field Effect Transistor).

These power components are, as is known, the subject of particular attention as to their state of operation in order to know, at each instant, if this component might be impacted by any degradation. Generally, checking the good state of this type of power component is done via current flowing through it between the two terminals of these three-pole components, namely the collector and the emitter for an IGBT transistor or even the drain and the source for a transistor of MOS type. Indeed, if these two terminals are passed through by an abnormal current or a short-circuit current, then it is probable that the operation of the transistor, even the very integrity of the component, is degraded.

Currently, the checking of the current flowing through the two terminals mentioned above is done via a tracking of the voltage or of the current directly between the two terminals mentioned, that is to say at the conduction channel of a transistor.

Usually, this operation of monitoring the integrity of the power component, directly on the current passing through the two terminals of the three-pole component, is done according to the following means:

Addition of an insulated current sensor at one of the two terminals of the power transistor. As an indication, a transformer positioned at the corrector (or the drain) makes it possible to directly evaluate the current passing through that terminal. Nevertheless, the use of a sensor causes the volume of the transistor to be increased.

The measurement of the current can also be done via a resistor positioned in series (that is to say a shunt) with respect to one of the two terminals passed through by the current that has to be measured. However, the use of a resistor for this purpose induces a high consumption of energy that the resistor dissipates.

The measurement of the current passing through the collector of the power transistor can also be done via a current mirror incorporated in the power component. The current mirror is an electrical circuit which makes it possible to copy the current passing through the collector and thus to have easy access to a portion of the value of the current passing through the latter. Nevertheless, this type of electrical circuit is very specific to particular types of electronic component. This architecture then necessitates large investment in terms of adaptation.

It is also possible to envisage studying the voltage at the collector via a diode. Nevertheless, this option increases the overall bulk in the power transistor and presents the drawback of being blind to the detection of a short-circuit for a time that corresponds to the off/on transition of the power transistor.

SUMMARY OF THE INVENTION

The invention aims to mitigate all or part of the problems cited above by proposing a detection device for detecting a short-circuit current between the collector (or the drain) and the emitter (or the source) of the power transistor that is simple, compact and that has a relatively low production cost.

To this end, the subject of the invention is a power stage comprising a power transistor controlled via a driver, the power transistor comprising three terminals, including a collector c, an emitter e and a gate g linked to the driver, the power stage also comprising a detection device for detecting a short-circuit current cc between the collector c and the emitter e, the detection device comprising a voltage sensor capable of detecting a voltage Vge at the gate g of the power transistor outside of a predefined voltage range.

According to one aspect of the invention, the detection device comprises an energy storage device configured to deliver an additional voltage to the gate g if the equivalent capacitance of the gate Cge is discharged.

According to one aspect of the invention, the energy storage device is an inductor positioned between the driver and the gate g of the power transistor.

According to one aspect of the invention, the power stage comprises a voltage reducer capable of reducing the voltage Vge at the gate g to a threshold voltage.

According to one aspect of the invention, the power stage comprises a recorder capable of recording a power transistor operation fault.

The invention also deals with a method for detecting a short-circuit current cc between a collector c and an emitter e of a power transistor comprising a gate g, the method comprising the following steps:

Detecting a voltage Vge at the gate g of the power transistor outside of a predefined voltage range,
Reducing the voltage at the gate g of the power transistor to a predefined reduction voltage,
Switching off the power transistor.

The invention offers the advantage of allowing the analysis of the current between the collector and the emitter of a power transistor by monitoring the gate voltage of the power transistor via a detection device that is compact and of simple design.

BRIEF DESCRIPTION OF THE DRAWINGS

The invention will be better understood and other advantages will become apparent on reading the detailed description of an embodiment given as an example, the description being illustrated by the attached drawing in which.

For clarity, the same elements will bear the same references in the various figures.

DETAILED DESCRIPTION

Figure 1:
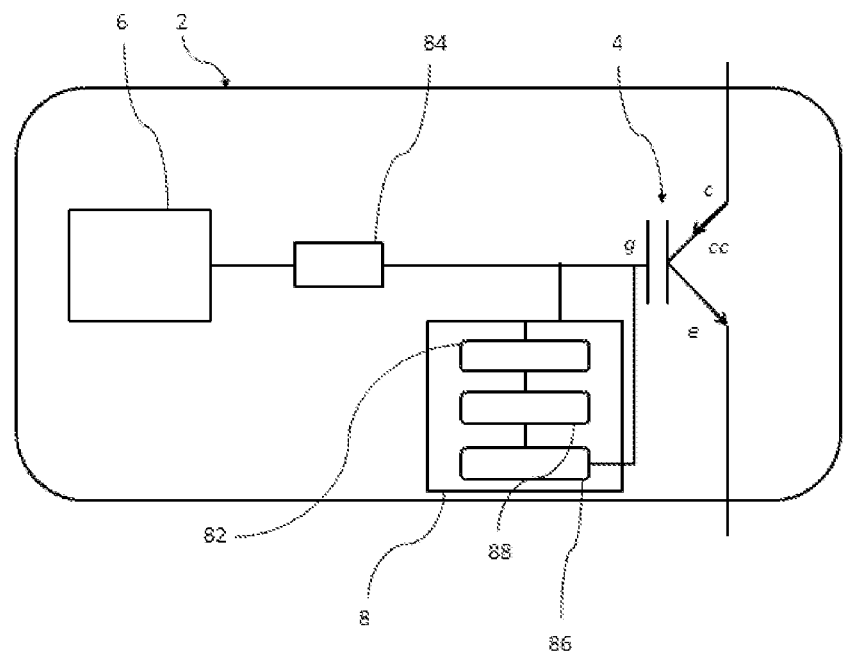
FIG. 1 represents a power stage comprising a power transistor and a detection device for detecting a short-circuit current according to the invention.

FIG. 1 represents a power stage 2 comprising a power transistor 4 controlled via a driver 6. The power transistor 4 comprises three terminals, including a collector c, an emitter e and a gate g linked to the driver 6. The power transistor 4 is an insulated gate bipolar transistor (IGBT). As a variant, the power transistor 4 is a field-effect transistor (metal oxide semiconductor field-effect transistor, or MOSFET) and therefore comprises a drain, a source and a gate linked to the driver 6. Consequently, for a field-effect transistor, the drain can be likened to the collector c, the source can be likened to the emitter e.

In this context, the invention consists in detecting and protecting the insulated gate power component, namely the power transistor 4, when the latter is passed through by an abnormal current. This abnormal current, called "short-circuit current", appears when a low impedance, called "short-circuit", is present at the terminals of an electrical source and has an intensity greater than a predefined intensity for so-called "normal" operation of the power transistor 4. This short-circuit current can be of two types:

A type 1 short-circuit which is a short-circuit applied during conduction of the power transistor 4, that is to say when the abnormal current is superimposed on a normal current. Consequently, in a type 1 short-circuit, a voltage measured between the gate g and the emitter e of the power transistor 4, called gate voltage Vge, of the power transistor 4 increases rapidly and in the same proportion as the increase in the short-circuit current.

A type 2 short-circuit which is a short-circuit established before the power transistor 4 is made to conduct. Consequently, when the power transistor 4 starts conducting, the abnormal current or short-circuit current immediately passes through the power transistor 4. In a type 2 short-circuit, the equivalent capacitance Cge seen from the gate g of the power transistor 4 remains constant and of low value compared to an equivalent capacitance measured at the gate of the power transistor 4 in so-called "normal" operation.

In other words, the type 1 short-circuit and the type 2 short-circuit are both linked to a circuit external to the power transistor 4, forming a closed electrical loop and comprising an electrical load, connected to the power transistor 4 via the collector c and the emitter e. Thus, a type 1 short-circuit is a short-circuit appearing in this external circuit while the power transistor 4 is already conducting whereas a type 2 short-circuit is a short-circuit already present in the external circuit before the conduction of the power transistor 4 is established.

Thus, the power stage 2 comprises a detection device 8 for detecting a short-circuit current cc between the collector c and the emitter e. The detection device 8 comprises a voltage sensor 82 capable of detecting and of measuring the voltage between the gate g and the emitter e called Vge at the gate g of the power transistor 4. More specifically, the voltage sensor 82 is configured to compare this measurement of gate voltage Vge to a defined voltage range, and signal if the measurement of gate voltage Vge is outside of the predefined voltage range. Indeed, the presence of a short-circuit in the power transistor 4, and in particular between the collector c and the emitter e, can be reflected by a significant increase in the intensity of the current between these two terminals of the power transistor 4 and causes degradation of the power stage 2. Now, this overvoltage induced by the increase in the current which passes through the power transistor 4 is expressed according to the following formula:

$$\Delta Vg = \frac{\Delta Ids}{Gm}$$

In which $\Delta Vg$ represents the variation of voltage Vge at the gate, $\Delta Ids$ represents the variation of the current between the collector c and the emitter e and Gm represents the transconductance of the power transistor 4. As an indicative example, the transconductance Gm is equal to 300 Siemens for example.

Consequently, it is possible to observe a proportional relationship, for the same transconductance of the power transistor 4, between the voltage Vge at the gate and the current between the collector c and the emitter e. More specifically, upon a significant increase in the intensity of the current between the collector c and the emitter e, synonymous with short-circuit current cc, the voltage Vge at the gate is also subjected to an increase in the voltage measurement performed by means of a voltage sensor 82. The voltage sensor 82, which is linked directly to the gate g, therefore makes it possible to measure the voltage Vge at the gate g so as to be able to detect a short-circuit current cc between the collector c and the emitter e of the power transistor 4.

As an example, the predefined voltage range within which the voltage Vge of the gate g lies is a voltage range lying between 0 volts and +20 volts. As a variant, this predefined voltage range is a voltage range lying between 2 volts and 20 volts in the case of use of an insulated gate field-effect transistor MOSFET. According to another variant, for the case of use of an insulated gate power transistor IGBT, the predefined voltage range is a voltage range lying between 5 volts and 20 volts.

Furthermore, the short-circuit can also be present before the power transistor 4 is made to conduct in the case of a type 2 short-circuit.

When the power transistor starts conducting, an abnormal current, or to put it another way, a short-circuit current, passes immediately through the power transistor. Also, the voltage value at the gate that is measurable does not increase as rapidly and it is not as significant as for a type 1 short-circuit. Consequently, the simple measurement of the voltage at the gate Vge is no longer sufficient since this measurement can be done later. Now, upon a short-circuit, the equivalent capacitance seen by the gate g of the power transistor remains constant and of low value, i.e. approximately ten times lower than when a "normal" current passes through the power transistor. Conversely, in normal operation, that is to say when the power transistor is saturated, the value of the capacitance, seen by the gate g, is increased, notably because of the Miller effect, when the voltage measured at the collector c is low. This equivalent capacitance measured at the gate g is of high value, and generally greater than a microfarad, at the switching instants. And, in a short-circuit, the switching instant does not then affect the value of the equivalent gate capacitance. The value of the equivalent gate capacitance remains constant and of low value, that is to say lower than a hundred nanofarads. This change can be understood as a change of charges at the gate.

Consequently, the variation of the voltage $\Delta V_g$ at the gate g is not significant enough in order to reveal a short-circuit current cc present in this transition phase. In order to reveal this type of short-circuit, the detection device 8 comprises a capacitance measurement sensor 83 capable of detecting and of measuring an equivalent capacitance value Cge of the gate g at the gate g of the power transistor 4. More specifically, the capacitance sensor 83 is configured to compare this gate equivalent capacitance measurement Cge to a predefined capacitance value, and signal if the gate equivalent capacitance measurement Cge is lower than the predefined capacitance value. In other words, when the equivalent capacitance of the gate Cge between the gate g and the conduction channel is discharged, the capacitance measurement sensor 83 is capable of detecting this equivalent capacitance value Cge, measuring this equivalent capacitance value Cge, comparing this equivalent capacitance value Cge with the normally measurable predefined capacitance value and signal the malfunction. Indeed, in nominal operation of the power transistor 4, that is to say at the switching instants, the equivalent capacitance of the gate Cge is temporarily of high value, that is to say for example greater than 1 µF. Conversely, when the conduction of the power transistor 4 is established, the equivalent capacitance of the gate Cge is of low value, that is to say for example approximately 100 nF. Consequently, when the measurement of the equivalent capacitance Cge at the gate g of the power transistor is lower than this low equivalent capacitance value for when the power transistor 4 is operating with conduction, a type 2 short-circuit is detected. As an indicative example, the predefined capacitance value can be a capacitance value of 100 nF.

As an indicative example, the capacitance measurement sensor 83 may be a Wheatstone bridge.

As a variant, It is also possible to envisage measuring this equivalent capacitance value of the gate Cge according to the following formula:

$$C_{ge} = \frac{Q_{ge}}{V_{ge}}$$

In which $Q_{ge}$ represents the gate charge and $V_{ge}$ represents the voltage between the gate and the emitter. The charge $Q_{ge}$ can be defined as integrating, with respect to time, the intensity of the current passing through the gate g. Furthermore, the value of the voltage at the gate Vge is already known through the voltage sensor 82. Thus, the capacitance measurement sensor 83 can also be a device for measuring the intensity of the current at the gate g configured to determine, according to the above formula, the equivalent capacitance value of the gate Cge.

The detection device 8 also comprises an energy storage device 84 configured to deliver an additional voltage to the gate g when the equivalent capacitance value measured at the gate Cge by the capacitance measurement sensor 83 is lower than the predefined capacitance value at the gate g. In other words, when the capacitance measurement sensor 83 detects that the equivalent capacitance value measured at the gate Cge is lower than the predefined capacitance value at the gate g, the capacitance measurement sensor 83 drives the energy storage device 84 such that the energy storage device 84 releases an additional voltage to the gate g. Now, the releasing of this additional voltage to the gate g then makes it possible to generate an overvoltage at the gate g. Consequently, the voltage Vge between the gate g and the emitter e increases in proportion to the additional voltage delivered by the storage device 84 until the predefined voltage range is exceeded. Consequently, the voltage sensor 82 detects that the voltage Vge at the gate g of the power transistor 4 is outside of the predefined voltage range and therefore signals a short-circuit in the power transistor 4 that makes it possible to switch off the power transistor 4 before its components are degraded. The energy storage device 84 is positioned between the driver 6 and the gate g of the power transistor 4 so as to be able to deliver the additional voltage to the gate g. As an indicative example, this additional voltage is the voltage necessary for the sum of the voltage measured at the gate g and of the additional voltage to be greater than the maximum voltage value of the predefined voltage range.

As an indicative example, the energy storage device 84 is an inductor, with an inductance value of approximately 100 nH, positioned between the driver 6 and the gate g of the power transistor 4. The inductor has the advantage of being a passive component that makes it possible to directly respond to a pulsed signal supplied by the driver 6 and allow the storage and restoration of sufficient energy to induce an overvoltage, when the equivalent capacitance seen from the gate of the power transistor 4 is low and discharged.

As a variant, the storage device 84 is an active generator that makes it possible to generate an additional voltage at the gate and that is driven by information from the driver 6.

Hereinafter in the description, the storage device 84 is likened to an inductor 84. Thus, as stated previously, the inductor 84 is positioned in series between the driver 6 and the gate g so as to produce an RLC resonant circuit between the driver 6, via a resistor included in the driver 6, the inductor 84 and the capacitance of the gate g and therefore ascertain the damping of the system. Now, the following relationship makes it possible to reveal an under-damping of the RLC resonant circuit that allows the inductor 84 to inject the additional voltage to the gate g according to the condition:

$$\frac{Rg}{2}\sqrt{\frac{Cge\_cc}{L}} < 1$$

In which Rg represents the resistance of the driver 6 in the RLC resonant circuit, Cge_cc represents the equivalent capacitance of the gate g when the power transistor 4 is subjected to a short-circuit and L represents the inductance value of the inductor 84.

Consequently, the inductor 84 has the advantage of allowing additional voltage to be added at the gate g of the power transistor so as to reveal the fact that the value of the voltage Vge of the gate g is not within the voltage range and therefore the presence of a short-circuit current cc during this transition phase of the power transistor 4.

Furthermore, the power stage 2 comprises a voltage reducer 86 capable of reducing the voltage Vge at the gate g to a threshold voltage, when a short-circuit current cc is detected between the collector c and the emitter e via the voltage sensor 82. More specifically, when the voltage Vge at the gate g detected by the voltage sensor 82 is not within the predefined voltage range, the voltage reducer 86 makes it possible to reduce this voltage Vge at the gate g in order to lie within the voltage range. As an example, the threshold voltage can be a voltage lower than 20 volts and/or greater than the voltage at which the power transistor starts to conduct, called Vgsth, and is preferentially a voltage of 10 volts. The voltage reducer 86 offers the advantage of being able to reduce the short-circuit current according to the relationship $$\Delta Vg = \frac{\Delta Ids}{Gm},$$

before switching oft the power transistor 4.

The power stage 2 also comprises a recorder 88 capable of recording the short-circuit of the power transistor 4. As an example, the recorder 88 is a capacitor which is discharged following the short-circuit in order to reveal a power transistor 4 operating fault.

Figure 2:
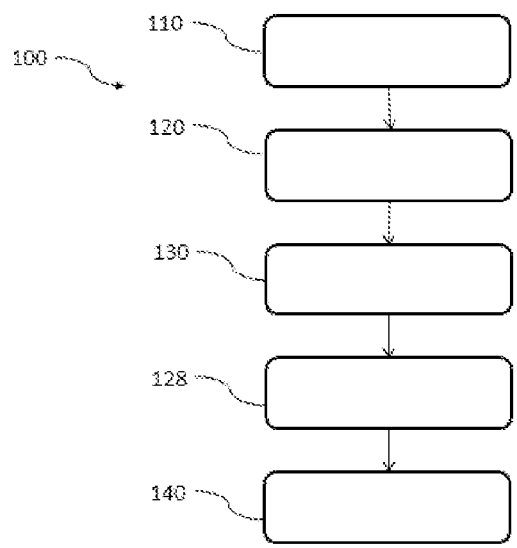
FIG. 2 represents a method for detecting a short-circuit current between a drain and a source of a power transistor according to the invention.

Also proposed is a detection method 100, represented in FIG. 2, for detecting a short-circuit current cc between a collector c and an emitter e of a power transistor 4, comprising a gate g. The detection method 100 comprises the following steps:

Detecting (step 120) the voltage Vge at the gate g of the power transistor 4 outside of the predefined voltage range. As an example, the predefined voltage range within which the voltage Vge of the gate g lies is a voltage range lying between 0 volts and +20 volts. The detection 120 of the voltage Vge is performed via the voltage sensor 84.

Reducing the voltage (step 130) at the gate g of the power transistor 4 to a predefined voltage. As a preferential example, the predefined reduction voltage can be 10 volts. Switching off (step 140) the power transistor 4.

The reduction of the voltage (step 130) at the gate g of the power transistor 4 can cause the power transistor 4 to be automatically switched off (step 140). As a variant, this switching off (step 140) can be controlled. Nevertheless, the control of the switching off 140 of the power transistor 4 must be prompt.

The detection method 100 can also comprise a step of restoration (step 110) of additional energy upstream of the detection step 120 if the equivalent capacitance of the gate Cge is discharged and lower than the predefined capacitance, that is to say, for example, a capacitance of approximately 100 nF.

The step of restoration 110 of the stored energy to the gate g makes it possible to add the additional energy that reveals a short-circuit when the power transistor 4 is switched.

The detection method 100 can also comprise, following the detection step 120, a step of recording of the fault (step 128) of the power transistor 4.

Figure 3:
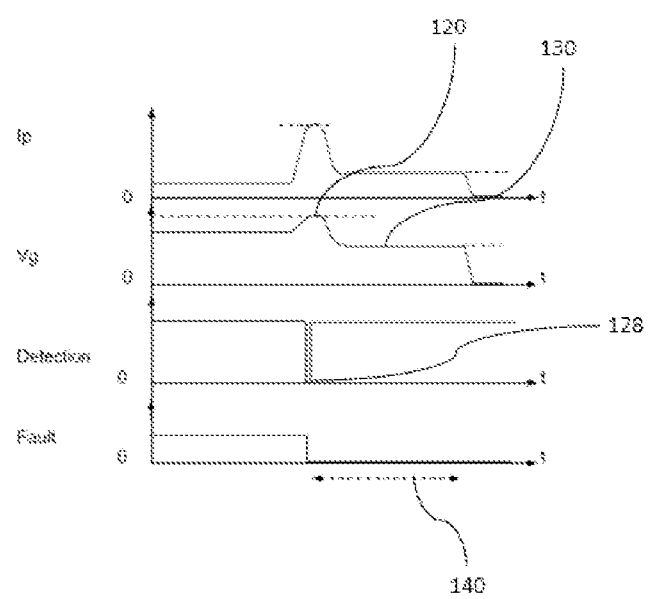
FIG. 3 represents the method for detecting a short-circuit current via a timing diagram.

The detection method 100 can also be interpreted according to the timing diagram represented in FIG. 3. Indeed, a short-circuit current at the power transistor 4 can be interpreted as a strong increase in the current Ip passing through the power transistor 4. Now, in the case of a type 1 short-circuit, this increase in the current is accompanied by an increase in the voltage Vge at the gate g of the power transistor 4. Consequently, the detection 120 is made when the voltage Vge is greater than 20 volts for example. This is then followed, in order not to damage the power transistor 4, by reduction of the voltage Vge (step 130) at the gate g of the power transistor 4 to the predefined voltage, such as 10 volts for example, and the switching off 140 of the power transistor 4. In the case of a type 2 short-circuit, the restoration 110 of sufficient energy to induce the overvoltage, if the equivalent capacitance of the gate Cge is discharged and lower than the predefined capacitance, that is to say, for example, a capacitance of approximately 100 nF, makes it possible to generate the detection 120 of this overvoltage at the gate. Furthermore, the step of recording of the fault 128 makes it possible, upon the detection 120 of the power transistor 4 operating fault, to store the fault in real time.

The invention therefore proposes incorporating a voltage sensor at the gate of the power transistor in order to detect an abnormal voltage, that is to say a voltage outside of a predefined voltage range for the gate g and incorporate a means that makes it possible to store and restore sufficient energy to induce a detection of an abnormal voltage, when the equivalent capacitance Cge seen from the gate of the power transistor 4 is discharged for the case of a type 2 short-circuit. The invention therefore offers the ability to detect a short-circuit in the power transistor based on the measurement of the voltage at the gate of the power transistor.

The invention claimed is:

1. A power stage comprising a power transistor controlled via a driver, the power transistor comprising three terminals including a collector c, an emitter e and a gate g linked to the driver, the power stage comprising a detection device for detecting a short-circuit current cc between the collector c and the emitter e, the detection device comprising a voltage sensor capable of detecting a voltage Vge at the gate g of the power transistor outside of a predefined voltage range, the detection device comprising a capacitance measurement sensor configured to measure an equivalent capacitance value Cge at the gate g of the power transistor and compare the gate equivalent capacitance value Cge to a predefined capacitance value, the detection device comprising an energy storage device configured to deliver an additional voltage to the gate g if the capacitance measurement sensor detects that the value of the gate equivalent capacitance Cge is lower than the predefined capacitance value.

2. The power stage according to claim 1, wherein the energy storage device is an inductor positioned between the driver and the gate g of the power transistor.

3. The power stage according to either of claim 1, comprising a voltage reducer capable of reducing the voltage Vge at the gate g to a threshold voltage.

4. The power stage according to claim 1, comprising a recorder capable of recording a power transistor operating fault.

5. A detection method for detecting a short-circuit current cc between a collector c and an emitter e of a power transistor comprising a gate g according to claim 1, the method comprising the following steps:
   detecting a voltage Vge at the gate g of the power transistor outside of a predefined voltage range,
   reducing the voltage at the gate g of the power transistor to a predefined reduction voltage,
   switching off the power transistor.

* * * * *